United States Patent [19]
Saeki

[11] Patent Number: 6,014,243
[45] Date of Patent: Jan. 11, 2000

[54] FM MODULATORS

[75] Inventor: Naoto Saeki, Tokyo, Japan

[73] Assignee: NEC Corporation, Tokyo, Japan

[21] Appl. No.: 09/150,774

[22] Filed: Sep. 10, 1998

[30] Foreign Application Priority Data

Sep. 30, 1997 [JP] Japan ................................. 9-265562

[51] Int. Cl.[7] .......................... H04B 10/04; G02F 1/015
[52] U.S. Cl. ............................ 359/278; 359/182; 372/28
[58] Field of Search ................................. 359/182, 181, 359/278, 183, 191; 372/28

[56] References Cited

FOREIGN PATENT DOCUMENTS

| | | |
|---|---|---|
| 3-209927 | 9/1991 | Japan . |
| 4-007882 | 1/1992 | Japan . |
| 5-188334 | 7/1993 | Japan . |
| 7-283785 | 10/1995 | Japan . |
| 9-232662 | 9/1997 | Japan . |
| 10-173604 | 6/1998 | Japan . |
| 10-190106 | 7/1998 | Japan . |
| 10-322284 | 12/1998 | Japan . |

OTHER PUBLICATIONS by Kikushima et al., "Optical Super Wide–Band FM Modulation Scheme and Its Application to Multi–Channel AM Video Transmissions Systems", IOOC '95 PS2–7, pp. 33–34 Pub. Jun. 1995.

by Kikashima et al., "Distortions of Optical Video Transmission Systems Employing AM/FM Converters and its Countermeasures", Technical Report of *Institute of Electronics, Information and Communication Engineers of Japan*, No. OCS96–7 of May 1996, pp. 43–48.

by Ishii et al., "Theoretical Analysis of Group Delay Distortion in the Fiber–Optic Video Distribution System Employing Super Wide–band Optical FM Scheme", Technical Report of *Institute fo Electronics, Information and Communication Engineers of Japan*, No. OCS96–40 of Jun. 1996, pp. 1–6.

*Primary Examiner*—Georgia Epps
*Assistant Examiner*—Margaret Burke
*Attorney, Agent, or Firm*—Young & Thompson

[57] ABSTRACT

An input signal input to a 180 degree distributor is distributed as two signals, one of which with its phase inverted 180 degrees is input to a first modulation light source and the other with its phase unchanged is input to a second modulation light source; both signals are modulated with the intensity and the frequency of the light emission dependent on signal amplitude. The modulated signals are coupled by an optical coupler and subjected to heterodyne detection through a photodetector, where their light intensity modulation components offset each other when added and the multiplication of their light frequency components results in the frequency transition quantity doubling.

10 Claims, 8 Drawing Sheets

CENTER 3.250GHz     SPAN 6.500GHz

Figure 8

CENTER 3.250GHz     SPAN 6.500GHz

Figure 9

CENTER 3.250GHz  SPAN 6.500GHz

FM MODULATORS

BACKGROUND OF THE INVENTION

1. Field of the Invention

This invention relates to FM modulators that perform signal modulation, in particular, heterodyne-type FM modulators designed to generate radio frequency signals.

2. Description of the Related Art

There have recently been requirements for FM modulators that are capable of generating FM signals in an even wider bandwidth than provided by conventional FM modulators. One candidate for such a FM modulator has utilized semiconductor lasers. As described in a book titled "Coherent Optical Fiber Communications", (authored by Okoshi, et al., published by Ohm-sha), on pages 132 to 134, these FM modulators make use of the semiconductor laser diode characteristics that the frequency of the output optical signal can be modulated according to injection current variation, as well as output signal intensity. In this modulation scheme, optical heterodyne technology is applied to enable an electric circuit to handle signals in a light frequency region in the order of several hundreds of THz (1 THz=$10^{12}$ Hz). A book, "Coherent Light Communication," authored by Shimada and published by the Institute of Electronics, Information and Communications, describes an aspect of the optical heterodyne technology on pages 9 to 18.

A combination of these technologies can achieve a heterodyne-type FM modulator that can provide FM signals in a wider band than accomplished by the conventional FM modulator.

Figure 1:
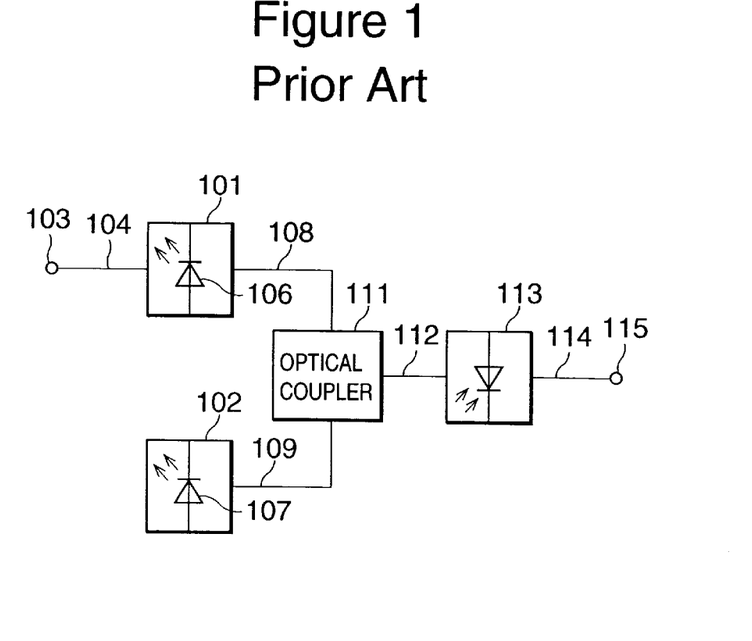
FIG. 1 is a block diagram showing a general structure of a conventional FM modulator.

FIG. 1 shows a general structure of a prior art FM modulator. This FM modulator is provided with two light sources; a light source 101 for modulation and a light source 102 used as a local oscillator. An electric signal 104 is designed to be supplied to an input terminal 103 of the light source 101 for modulation. The light source 101 for modulation has a first light emitting element 106 and the light source 102 used as local oscillator has a second light emitting element 107. The light from the first light emitting element 106 is modulated by the input electric signal 104.

A modulated light signal 108 emerging from the light source 101 for modulation and a signal 109 output from the light source 102 for local oscillation are input to an optical coupler 111, whose output signal is emitted as a light signal 112. The light signal 112 is designed to be subjected to heterodyne detection through a light receiving element 113 and output from an output terminal 115 as an output signal 114.

Some transmission systems employing these FM modulators were disclosed, for example, in "Optical Super Wide-Band FM Modulation Scheme and Its Application to Multi-Channel AM Video Transmission Systems", by Kikushima, et al. in IOOC '95 PS2-7, published in 1995 and "Noise Characteristics of Wide-Band FM Modulators" by Ishiguro, et al., in 1996 Spring Convention record of Institute of Electronics, Information and Communication Engineers of Japan, No. B-1207. These conventional FM modulators have realized the generation of wide bandwidth FM signals. However, there has arisen a new problem that a parasitic intensity modulation component accompanying FM modulation of a semiconductor laser by applying a injection current variation may deteriorate the transmission quality. This problem is discussed in detail in "Distortions of Optical Video Transmission Systems Employing AM/FM Converters and its Countermeasures", by Kikushima et al. in Technical Report of Institute of Electronics, Information and Communication Engineers of Japan, No. OCS96-7 published in May, 1996.

According to the above-mentioned document, Kikushima, et al. attempted to adjust the power ratio of the light for local oscillation to the light for modulation in order to suppress intensity modulation components. In FM modulators to which this power ratio adjustment was applied, however, the adjustment was made so that the optical power for local oscillation would be higher and that for modulation lower. As a result, the power of an electric signal obtained by optical heterodyne detection decreases, which results in increased noise, that is, the noise characteristic is degraded.

There has been another proposed scheme, in which the intensity modulation components is suppressed by passing the heterodyne-detected signal through a high-pass filter. This scheme is based on a fact that the intensity modulation components of an FM-modulated semiconductor laser exist in a lower frequency band than the FM modulation components. Intensity modulation components in lower bands can be suppressed by passing the heterodyne-detected signal through the high-pass filter. However, this approach also has a problem that the distortion characteristic is deteriorated by the frequency-dependent delay of the high-pass filter. This deterioration of the distortion characteristic is described in "Theoretical Analysis of Group Delay Distortion in the Fiber-Optic Video Distribution System Employing Super Wide-band Optical FM Scheme", by Ishii et al. in Technical Report of Institute of Electronics, Information and Communication Engineers of Japan, No.OCS96-40 published in June, 1996. In addition to the above-mentioned problems, optical heterodyne type FM modulators generate another distortion component due to nonlinear characteristics of semiconductor laser diodes. To reduce this distortion, it is necessary to decrease the power of signals to be input to semiconductor laser diodes. However, a decrease in the input signal power also decreases frequency displacement of FM modulated signals, which results in deteriorated noise characteristics.

As stated in Japanese Patent Laid-Open Publication No.3-209927 for a heterodyne transmitter for which frequency conversion was conducted using an intermediate frequency for radio frequency signal conversion, an attempt was made as follows: an n-multiple wave generator unit was used to generate a signal of n times the intermediate frequency. The output signal phase for the n-multiple wave generator was adjusted by a phase adjusting unit. The amplitude for the phase adjusting unit output signal was adjusted by an amplitude adjusting unit. Then, the output signal for the amplitude adjusting unit was combined with an intermediate frequency signal in a combiner unit. The combined signal was routed to a frequency conversion unit where the signal was modulated by a local oscillation frequency. By the above configuration, it is possible to eliminate unnecessary components produced by the distortion from the mixed modulation of a local oscillation frequency signal and an intermediate frequency signal.

Figure 2:
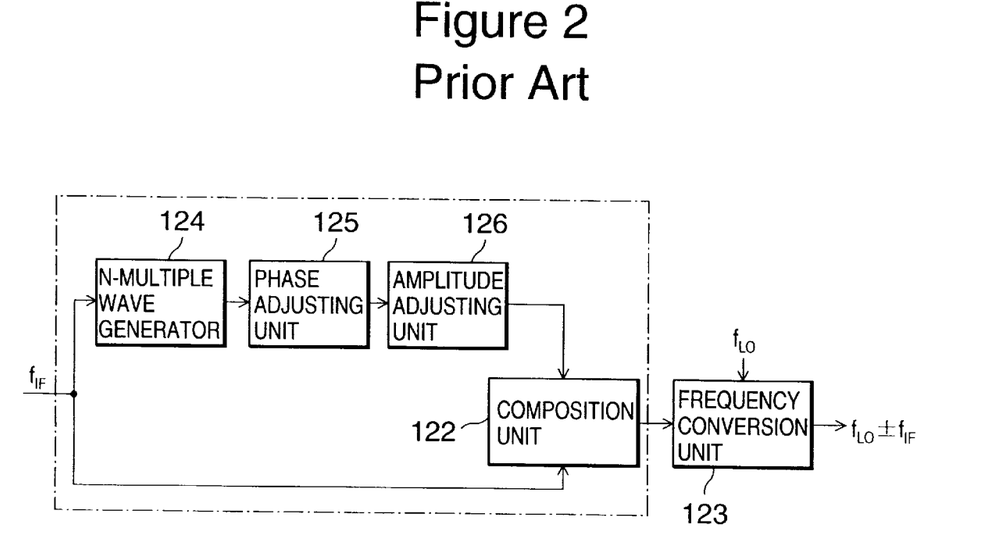
FIG. 2 is a block diagram showing a configuration of a heterodyne transmitter presented in Japanese Patent Laid-Open Publication No.03-209927.

FIG. 2 shows a configuration of the heterodyne transmitter presented in the above-mentioned Japanese Patent Laid-Open Publication. This heterodyne transmitter consists of a signal processing unit 121 which processes an input intermediate frequency signal $f_{IF}$, and a frequency conversion unit 123 where the frequency of the signal output from a combiner unit 122 in the signal processing unit 121 is modulated by a local oscillation frequency $f_{LO}$. The signal processing unit 121 comprises an n-multiple wave generator unit 124 which generates a signal having n times the input intermediate signal frequency $f_{IF}$, a phase adjusting unit 125 which adjusts the phase of the output signal from the n-multiple wave generator unit 124, an amplitude adjusting unit 126 which adjusts the amplitude of the output signal from the phase adjusting unit 125, and a combiner unit 122 where the output signal from the amplitude adjusting unit 126 is combined with the intermediate frequency signal $f_{IF}$.

By frequency conversion of the output signal from the signal processing unit 121 with local oscillator output of frequency $f_{LO}$ in the frequency conversion unit 123, this heterodyne transmitter can obtain a signal with a radio frequency $f_{LO} \pm f_{IF}$, without unnecessary frequency components produced by the distortion from the mixed modulation of the signal with a local oscillation frequency $f_{LO}$ and the signal with an intermediate frequency $f_{IF}$.

Figure 3:
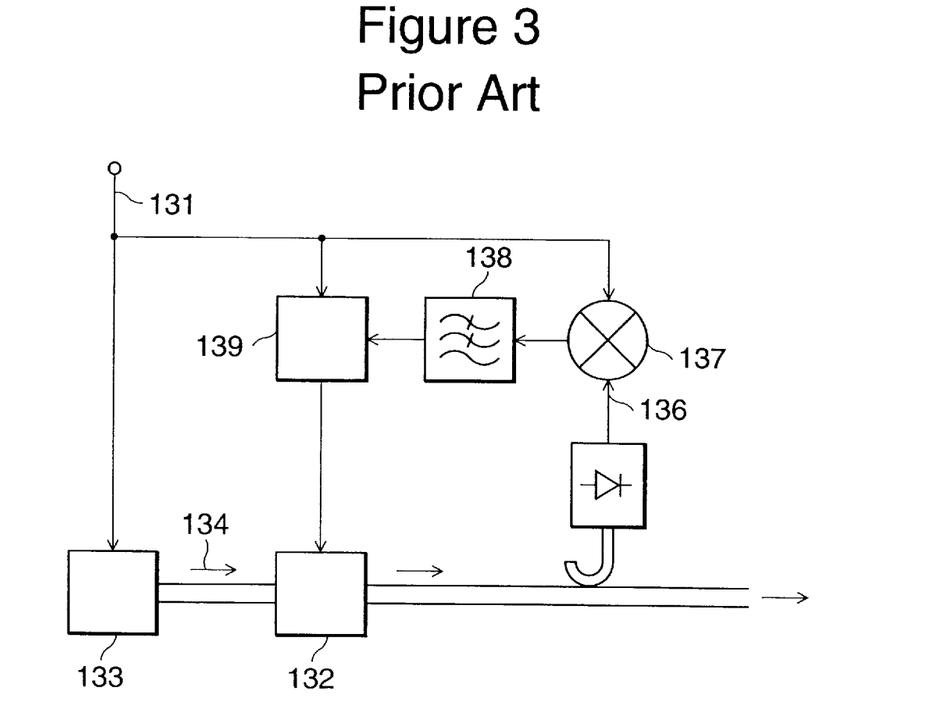
FIG. 3 is a block diagram showing a configuration for implementing a method of eliminating unnecessary optical amplitude modulation components, described in another Japanese Patent Laid-Open Publication No.05-188334.

FIG. 3 shows an another configuration for eliminating unnecessary amplitude modulation components, which was disclosed in Japanese Patent Laid-Open Publication No.05-188334. In this method, an optical intensity modulator 132 is used for applying inverse amplitude modulation to PSK- or FSK-modulated optical signal to eliminate unnecessary amplitude modulation components. In this configuration, a phase difference between the residual amplitude modulation component 136 and the digital signal 131 is detected by an analog multiplier, which consists of a mixer 137 and a low-pass filter 138, in order to control the modulation index of the inverse amplitude modulation. The amplitude of the digital signal 131 is controlled by a variable amplifier 139 so that the output of the analog multiplier is zero, thus eliminating unnecessary light amplitude modulation components.

In the conventional circuit shown in FIG. 2, unnecessary components caused by the nonlinearity of the heterodyne detector can be canceled. However, unnecessary intensity modulation components included in optical signals which are input to the optical heterodyne detector cannot be canceled.

The conventional circuit shown in FIG. 3 employs the light source for modulation 101 shown in FIG. 1 in order to cancel unnecessary intensity modulation components. Therefore, the loss is increased due to the additional loss of the optical intensity modulator, which decreases the level of the optical input to the light heterodyne detector. The decreased level leads to the noise characteristics degradation. Furthermore, due to intrinsic poor linearity of the optical intensity modulation, the distortion characteristic is greatly deteriorated. In addition, the configuration in FIG. 3 requires expensive components, such as an optical intensity modulator, and complicated control circuits.

SUMMARY OF THE INVENTION

In view of the foregoing and other problems of conventional FM modulators, an object of the present invention is to provide FM modulators that are able to sufficiently suppress the intensity modulation components.

According to one aspect of the present invention, an inventive FM modulator is provided with a first light emitting device for modulation which emits a first frequency-modulated optical signal according to a first input signal, a second light emitting device for modulation which emits a second frequency-modulated optical signal according to a second input signal, and an optoelectric conversion circuit which receives and mixes the first and said second frequency modulated optical signals for heterodyne detection, wherein the second input signal has the inverted phase of the first input signal.

Additionally, instead of the above-mentioned configuration, an FM modulator of the present invention may have a signal inverting circuit which inverts the phase of one of the first and said second input signal and provides a phase-inverted signal as the other input signal.

Further, an FM modulator of the present invention may include an optical coupler which couples the first and the second frequency-modulated optical signals and provides the coupled optical signal for the optoelectric conversion circuit.

Further, an FM modulator of the present invention includes a 180 degree distributor which distributes input signal to a plurality of outputs, and has two output signals used for the first and second input signals with phases inverted with respect to each other.

An FM modulator of the present invention may further includes a divider for splitting an input signal to a plurality of divided signals, an inverting amplifier which inverts by 180 degrees one of the divided signals and in-phase amplifier which amplifies another one of the divided signals, wherein outputs of the inverting amplifier and the in-phase amplifier are utilized as the first and second input signals.

The coupling ratio for the optical coupler may preferably be designed so as to suppress optical intensity modulation components which may be included in the output of the optical coupler.

Also, the first and second light emitting devices for modulation may preferably have the same input and output characteristics.

According to another aspect of the present invention, an FM modulator includes a divider for splitting an input signal into first and second divided signals, a first light emitting device for modulation, a second light emitting device for modulation, an optical coupler which optically couples the outputs of the first and second light emitting devices for modulation and an optoelectric conversion circuit which receives the output of the optical coupler for heterodyne detection, wherein the first light emitting device comprises a semiconductor laser diode with its anode provided with a first power supply voltage and said first divided signal, and said second light emitting device comprises a semiconductor laser diode with its cathode provided with a second power supply voltage and said second divided signal.

According to another aspect of the present invention, an FM modulator comprises a differential amplifier with light sources which outputs a first and a second optical signals, an optical coupler which optically couples the first and second optical signals and an optoelectric conversion circuit which receives the output of the optical coupler for heterodyne detection, wherein the differential amplifier with light sources comprises two transistors with their emitters connected directly or via resistors, an intermediate point between said emitters connected to a first constant voltage source via a current source, each of their collectors connected to a second constant voltage source via a first and second semiconductor laser diodes outputting the first and second optical signals, their bases provided with input signals having opposite phases with each other.

BRIEF DESCRIPTION OF THE DRAWINGS

The above and other objects, features and advantages of the present invention will become more apparent from the following detailed description when taken in conjunction with the accompanying drawings wherein.

DESCRIPTION OF THE PREFERRED EMBODIMENTS

The present invention is described in detail below, using several embodiments of the present invention.

Figure 4:
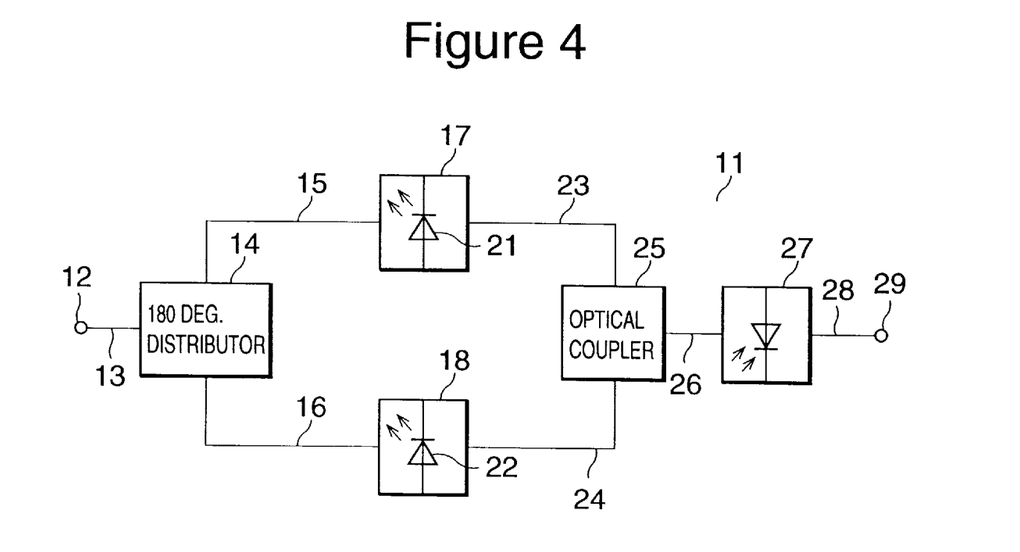
FIG. 4 is a block diagram of a first embodiment of an FM modulator according to the present invention.

FIG. 4 shows the structure of an optical heterodyne type FM modulator selected as an example of the implementation of this invention. This FM modulator 11 comprises a 180 degree distributor 14, a first modulation light source 17, a second modulation light source 18, an optical coupler 25, photodetector 27. Electric signals 13 are inputted through an input terminal 12. The 180 degree distributor 14 divides electric signals 13 into two separate output signals. These two signals, that is, a first and a second signal 15 and 16 are equal in amplitude and frequency, whereas these phases are 180 degree inverted with respect to each other. The first signal 15 is inputted to the first modulation light source 17 and the second signal 16 to the second modulation light source 18. The first modulation light source 17 comprises a first light emitting device 21 and the second modulation light source 18 comprises a second light emitting device 22. Output lights of the light emitting devices 21 and 22 are modulated by the input signals 15 and 16, respectively.

Modulated light signals 23 and 24, outputted from the first modulation light source 17 and the second modulation light source 18 respectively, are coupled by an optical coupler 25 and outputted as coupled light signals 26. Coupled light signal 26 is subjected to heterodyne detection through a photodetector 27 and outputted from an output terminal 29 as output signal 28.

Figure 5:
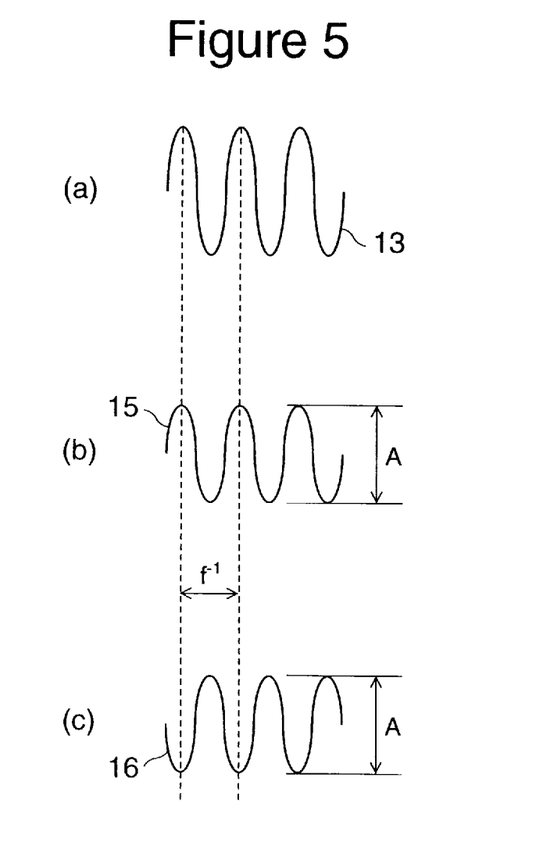
FIG. 5 shows input and output waveforms of the 180 degree distributor used in the first embodiment.

FIG. 5 shows the input and output waveforms for the 180 degree distributor 14. FIG. 2(a) shows the waveform of an electric signal 13 inputted to the 180 degree distributor 14. The first signal 15 outputted from the 180 degree distributor 14 has an amplitude of A and a frequency of f as shown in FIG. 5(b), and the second signal 16 outputted from the 180 degree distributor 14 has the same amplitude of A and frequency of f, whereas its phase being inverted to the phase of the first signal, as shown in FIG. 5(c). The first signal 15 is inputted to the first modulation light source 17 and the second signal 16 to the second modulation light source 18.

The first modulation light source 17 is designed such that the larger the amplitude of the first signal 15, the stronger will be the intensity of output light power and the lower the frequency of output power. Similarly, the second modulation light source 18 is designed such that the larger the amplitude of the second signal 16, the stronger will be the intensity of light emission and the lower the frequency of light emission. For this purpose, semiconductor laser diodes can be adopted for the first and second modulation light sources. Since the phases of the first and the second signals 15,16 are opposite to each other, the amplitude of the second signal 16 decreases with increase in the amplitude for the first signal 15. Let us consider how the modulation operation depends on the input signal 13 input to the 180 degree distributor 14. For the first modulation light source 17, the larger the amplitude of the input signal 13, the stronger will be the intensity of light emission and the lower the frequency of light emission. On the contrary, for the second modulation light source 18, the larger the amplitude of the input signal 13, the weaker will be the intensity of light emission and the higher the frequency of light emission. Therefore, when the two modulated light signals 23 and 24 are heterodyne-detected in the photodetector 27 after coupled by the optical coupler 25, their intensity modulation components are added and cancel each other. This is represented in the following equation (1) with amplitude A, mentioned above:

$$A \sin \omega t + A \sin (\omega t + \pi) = A \sin \omega t - A \sin \omega t = 0 \qquad (1)$$

On the other hand, their frequency components multiply with each other so that the original frequency displacement doubles. This consequence is expressed as follows: the frequency modulation component for the first light emitting device 21 is represented in equation (2) below; the frequency modulation component for the second light emitting device 22 is represented in equation (3) below; and equation (4) represents the frequency displacement.

Frequency modulation component for the first light emitting device 21: $\sin (\alpha t + A \sin \omega t)$. . . (2)

Frequency modulation component for the second light emitting device 22: $\sin (\beta t - A \sin \omega t)$. . . (3)

Frequency displacement: $\sin (\alpha t + A \sin \omega t) \times \sin (\beta t - A \sin \omega t) = [\cos \{(\alpha - \beta)t + 2A \sin \omega t\} - \cos (\alpha + \beta)t]/2$ . . . (4)

where, in all these equations, $\alpha$ denotes an angular frequency of the first modulation light source, $\beta$ denotes an angular frequency of the second modulation light source, $\omega$ denotes an angular frequency of an input signal, and t denotes the time. The term, $\cos (\alpha + \beta) t$, in the equation (4), has too high frequency for an actual electrical circuit to be detected.

Figure 6:
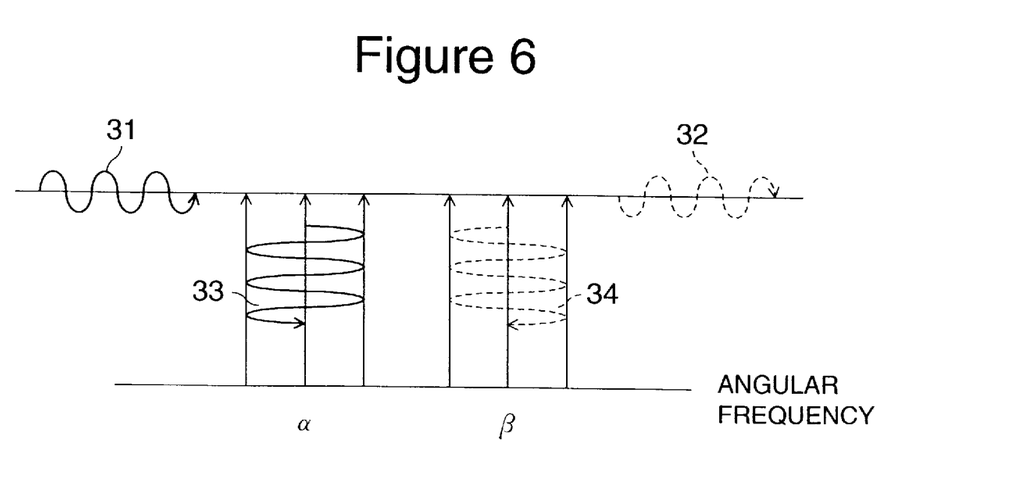
FIG. 6 is a schematic representation of the modulation by the first and the second optical emitting elements.

FIG. 6 is a schematic representation of the modulation performed by both the first and second light emitting devices. One intensity modulation component, indicated by 31, for the first light emitting element 21 (FIG. 4) and another intensity modulation component, indicated by 32, for the second light emitting element 22 (FIG. 4) offset each other, so that these intensity modulation components, which otherwise proved to be an interference factor previously, will be suppressed. In addition, since one frequency modulation component, indicated by 33, for the first light emitting element 21 and another frequency modulation component, indicated by 34, for the second light emitting element 22 are present apart from each other symmetrically, the frequency transition can be increased twice as much as that for prior modulators. Therefore, the level of signals applied to both the first and second light emitting devices 21 and 22 can substantially be reduced by 50%, so that the generation of distortion can be reduced.

Figure 7:
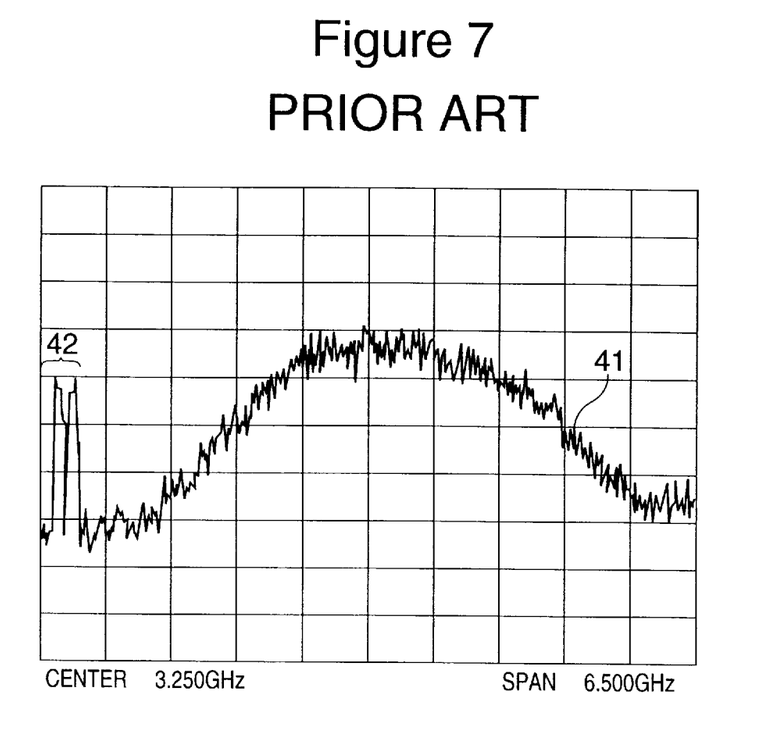
FIG. 7 is an output signal spectrum of the conventional optical heterodyne FM modulator.
Figure 8:
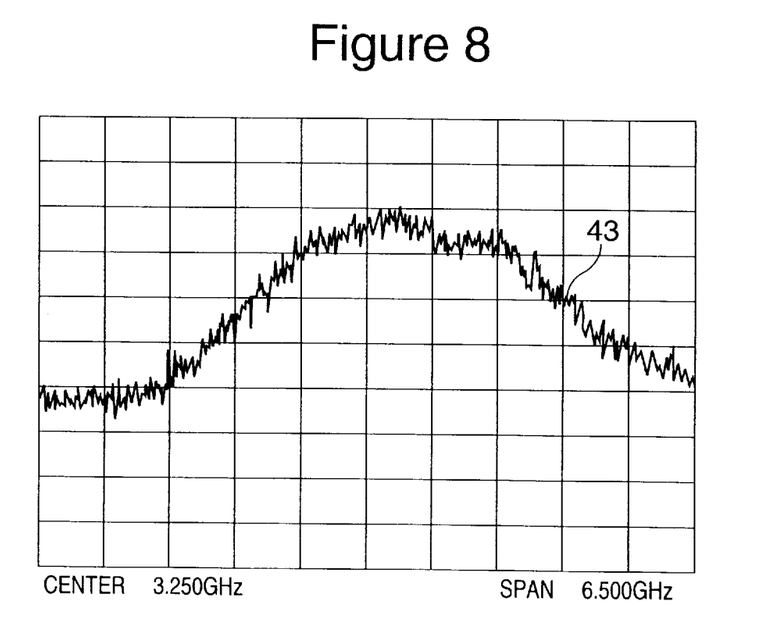
FIG. 8 is an output signal spectrum of the first embodiment.

FIGS. 7 and 8 show different output signal spectra: FIG. 7 shows the spectrum for a prior art optical heterodyne FM modulator and FIG. 8 shows that for an optical heterodyne FM modulator introduced as an example of the implementation of this invention. In FIG. 7, intensity modulation components, as indicated by 42, appear in FM modulated signals 41. Whereas, as seen from FIG. 8, for the FM modulator example of the implementation of this invention, no intensity modulation components appear in FM modulated signals 43; that is, this result proves that this FM modulator enables the intensity modulation components to offset each other almost completely.

Figure 9:
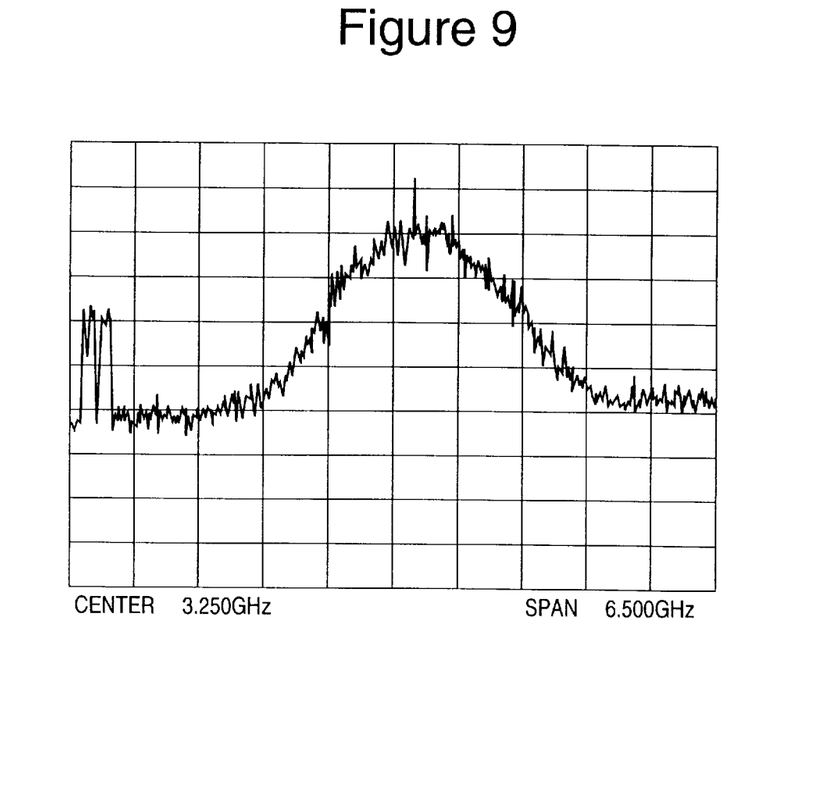
FIG. 9 shows optical frequency displacement for the first embodiment.

FIG. 9 shows the output signal spectrum for each of the first and the second modulation light sources, each of which is modulated with half of the original circuit input power, the 180 degree distributor 14 having split input signal 13 into two outputs 15 lnd 16. As can be seen from FIGS. 7 and 8, an equivalent frequency displacement by the present invention to that which is obtained with the conventional modulators, with only half of input signal power applied to each light source. This figure indicates that signal input to each light source of the present modulator can be reduced to half of that of the conventional modulators. Therefore, using the present modulator, the nonlinearity due to high power signal input to the modulation light sources can also be reduced.

Figure 10:
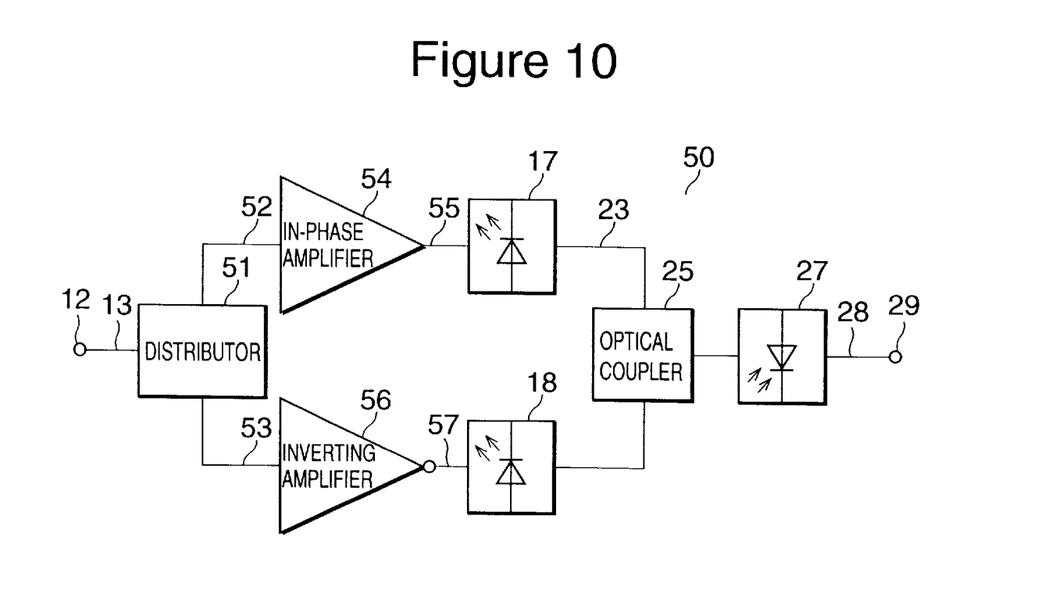
FIG. 10 is a block diagram of a second embodiment of an FM modulator according to the present invention.

FIG. 10 shows the second embodiment for the structure of an FM modulator according to the present invention. The same components as in FIG. 4 are labeled with the same numbers. In this embodiment, electric signals 13 supplied to an input terminal 12 are routed into two routes by a distributor 51 to distribute them as a first signal 52 and a second signal 53, both of which have the same phase. First signal 52 is input to an in-phase amplifier 54, amplified in the same phase as that of the input signals. The amplified output is inputted to a modulation light source 17. Second signal 53 is inputted to an inverting amplifier 56, where they are amplified and subjected to phase inversion. The amplifier 56 output is inputted to a light source for local oscillation 18 as second amplified signal 57. The rest of the circuit is the same as the first embodiment.

Figure 11:
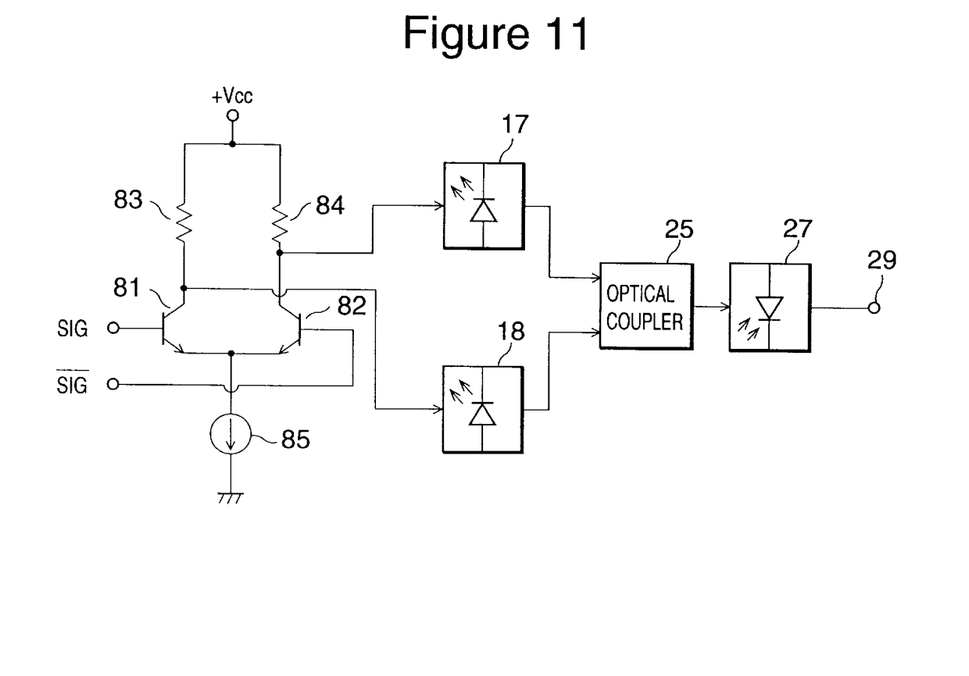
FIG. 11 shows another configuration for the second embodiment.
Figure 12:
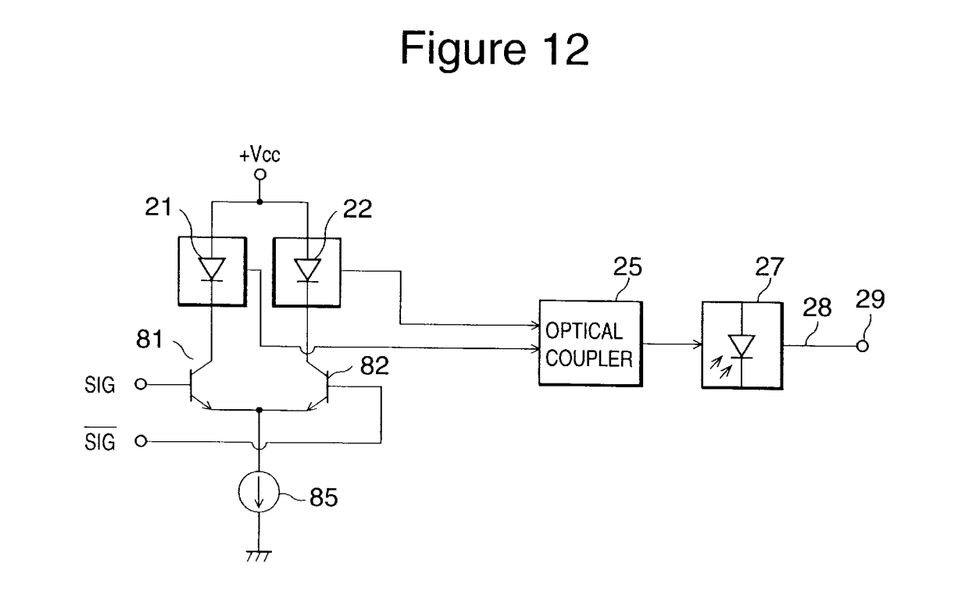
FIG. 12 shows a simplified version for the configuration shown in FIG. 11.

Although the second embodiment employs two amplifiers, the in-phase amplifier 54 and the inverting amplifier 56, a phase inverter may be used in place of the inverting amplifier 56. If electric signal 13 do not need amplification in these stages, the in-phase amplifier 54 can be removed. Also, an amplifier that can output complementary signal can be used for in-phase and inverting amplifiers 54, 56. In that case, the number of required amplifiers can be reduced to half compared to the configuration in FIG. 10. As the complementary amplifier, a well-known differential amplifier can be adopted. Furthermore, as shown in FIG. 11, the differential amplifier may comprise two transistors 81,82, with emitters directly connected and collectors connected to a first common constant voltage via load resistances 83,84, with the transistor bases being used for complementary signal input terminals. The connected emitters are further connected to a second common constant voltage via a current source 85. The emitters may be connected via resistors to improve amplifier linearity in a conventional way. In order to further simplify the modulator circuit, the load resistances can be replaced by the light emitting devices 21,22.

Figure 13:
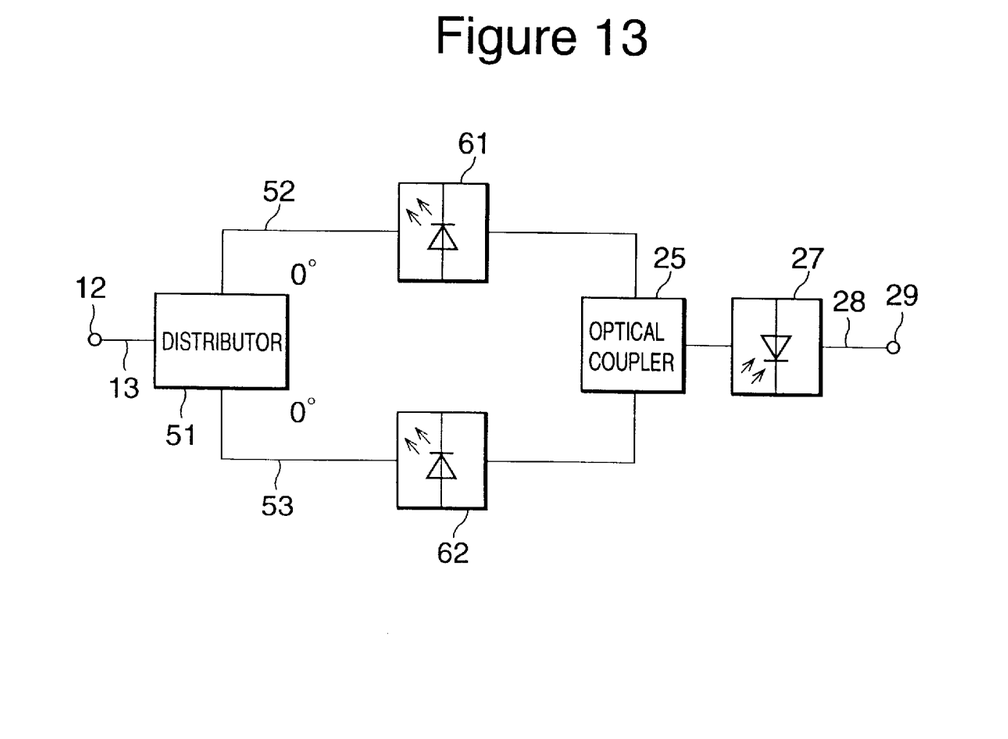
FIG. 13 is a block diagram of a third embodiment of an FM modulator according to the present invention.

FIG. 13 shows the structure for the third embodiment of an FM modulator according to the present invention. The same components as in FIG. 4 are labeled with the same numbers. In this embodiment, first signal 52 outputted from a distributor 51 is supplied to a first modulation light source 61 and second signal 53, which is in the same phase as first signal 52, is a second modulation light source 62.

Figure 14:
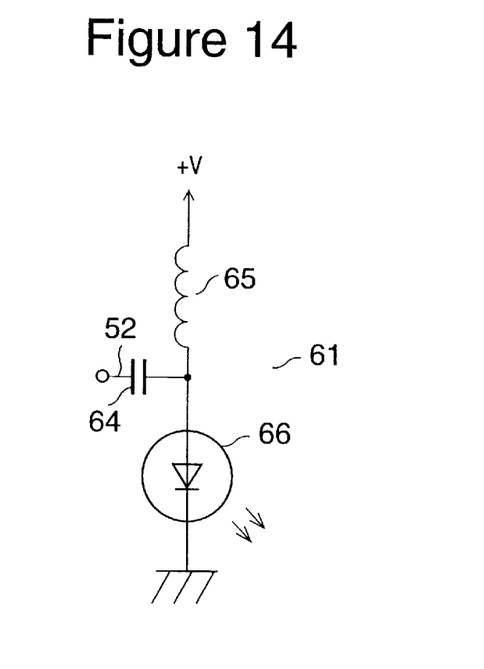
FIG. 14 is a block diagram showing the structure of the first light source for modulation in the third embodiment.
Figure 15:
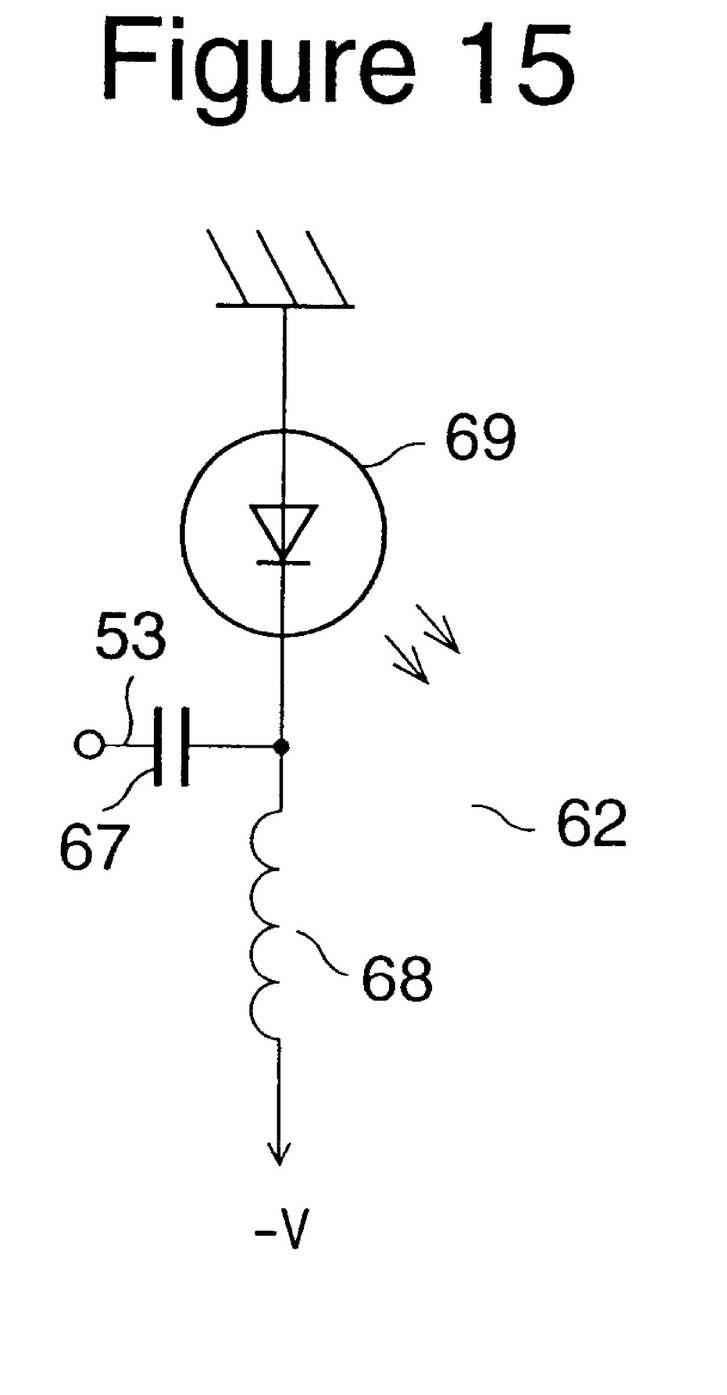
FIG. 15 is a block diagram showing the structure of the second light source for modulation in the third embodiment.

FIGS. 14 and 15 represent the first modulation light source and the second modulation light source, respectively. As shown in FIG. 14, the first modulation light source 61 comprises a capacitor 64, an inductor 65, one end of which is connected to the capacitor and the other end connected to the positive power source, and a semiconductor laser diode 66, the cathode of which is connected to the connection point between the inductor 65 and the capacitor 64 and its anode is connected to ground. When a first signal 52 is supplied to the capacitor 64, the output light intensity of the semiconductor laser diode 66 will be modulated by the first signal 52.

As shown in FIG. 15, the second modulation light source 62 comprises a capacitor 67, an inductor 68, one end of which is connected to the capacitor and the other end connected to the negative power source, and a semiconductor laser diode 69, the cathode of which is connected to the connection point between the inductor 68 and the capacitor 67 and its anode end is grounded. When a second signal 53 is supplied to the capacitor 67, the output light intensity of the semiconductor laser diode 69 will be modulated by the second signal 53. For the first modulation light source 61, as the amplitude of the first signal 52 increases, the voltage applied to the semiconductor laser diode 66 increases and more current flows across the diode. As a result, the intensity of light emission becomes stronger, while the frequency of light emission becomes lower. For the second modulation light source 62, on the other hand, as the amplitude of the second signal 53 increases, the voltage applied to the semiconductor laser diode 68 decreases and less current flows across the diode. As a result, the intensity of light emission becomes weaker, while the frequency of light emission becomes higher.

The outputs from the first and second modulation light sources 61 and 62 will be coupled by an optical coupler 25 (FIG. 13), and after subjected to heterodyne detection through a photodetector 27, outputted from an output terminal 29 as output signal 28. Although, in the third embodiment, the first and second signals 52 and 53 are designed to be routed via the capacitors 64 and 67 and input to the first and second modulation light sources 61 and 62, other schemes for inputting the signals can be applied.

Furthermore, suppression of intensity modulation components can be improved by adjusting the coupling ratio for the optical coupler used in the above embodiments. For adjustment, an optical variable attenuator is inserted in one of input ports of the optical coupler. With monitoring the intensity modulation components included in the photodetector output signal, an attenuation for the attenuator is changed to minimize the intensity modulation components. The obtained optimum attenuation and the coupling ratio determine the optimum coupling ratio for an optical coupler.

Instead of using an optical coupler with optimum coupling ratio, an optical attenuator with optimum attenuation determined above can be inserted in place of the optical variable attenuator.

As described above, the FM modulators according to the present invention have made possible that the intensity components of light emission offset each other by coupling two light signals with phases opposite to each other through the optical coupler and inputting to the photodetector where heterodyne detection is performed. Further, these modulators have acquired another advantage that they can increase the frequency transition quantity to a great extent by the multiplication of the frequency components of light emission.

While this invention has been described in connection with certain preferred embodiments, it is to be understood that the subject matter encompassed by way of this invention is not to be limited to those specific embodiments. On the contrary, it is intended for the subject matter of the invention to include all alternative, modification and equivalents as can be included within the spirit and scope of the following claims.

What is claimed is:

1. An FM modulator comprising:
   a first light emitting device for modulation which emits a first frequency-modulated optical signal according to a first input signal;
   a second light emitting device for modulation which emits a second frequency-modulated optical signal according to a second input signal; and
   an optoelectric conversion circuit which receives and mixes said first and said second frequency modulated optical signals for heterodyne detection,
   wherein said second input signal has an inverted phase of said first input signal.

2. The FM modulator of claim 1, further comprising a signal inverting circuit which generates one of said first and said second input signals.

3. The FM modulator of claim 1, further comprising an optical coupler which couples said first and said second frequency-modulated optical signals and provides the coupled optical signal for said optoelectric conversion circuit.

4. The FM modulator of claim 1, further comprising a 180 degree distributor which distributes a circuit input signal to a plurality of outputs and two output signals used for said first and said second input signals with phases inverted with respect to each other.

5. The FM modulator of claim 1, further comprising:
   a divider for splitting an input signal to plurality of divided signals;
   an inverting amplifier which inverts by 180 degrees one of said divided signals; and
   in-phase amplifier which amplifies another one of said divided signals,
   wherein outputs of said inverting amplifier and said in-phase amplifier are utilized as said first and said second input signals.

6. The FM modulator of claim 3, wherein a coupling ratio for said optical coupler is designed so as to suppress optical intensity modulation components which may be included in output of said optical coupler.

7. The FM modulator of claim 3, further comprising an optical attenuator inserted in an input port of said optical coupler.

8. The FM modulator of claim 1, wherein said first and said second light emitting devices for modulation have the same input and output characteristics.

9. An FM modulator comprising:
   a divider for splitting an input signal into first and second divided signals;
   a first light emitting device for modulation;
   a second light emitting device for modulation;
   an optical coupler which optically couples outputs of said first and said second light emitting devices for modulation; and
   an optoelectric conversion circuit which receives the output of said optical coupler for heterodyne detection,
   wherein said first light emitting device comprises a semiconductor laser diode with its anode provided with a first power supply voltage and said first divided signal, and
   said second light emitting device comprises a semiconductor laser diode with its cathode provided with a second power supply voltage and said second divided signal.

10. An FM modulator comprising:
    a differential amplifier with light sources which outputs first and second optical signals;
    an optical coupler which optically couples said first and said second optical signals; and
    an optoelectric conversion circuit which receives the output of said optical coupler for heterodyne detection,
    wherein said differential amplifier with light sources comprises two transistors with their emitters connected, an intermediate point between said emitters connected to a first constant voltage source via a current source, each of their collectors connected to a second constant voltage source via a first and second semiconductor laser diodes outputting said first and second optical signals, and their bases provided with input signals having opposite phases with each other.

* * * * *